United States Patent
Peussa

(10) Patent No.: US 11,603,312 B2
(45) Date of Patent: Mar. 14, 2023

(54) MEMS ELEMENT WITH INCREASED DENSITY

(71) Applicant: MURATA MANUFACTURING CO., LTD., Nagaokakyo (JP)

(72) Inventor: Marko Peussa, Espoo (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 44 days.

(21) Appl. No.: 17/081,416

(22) Filed: Oct. 27, 2020

(65) Prior Publication Data

US 2021/0122628 A1 Apr. 29, 2021

(30) Foreign Application Priority Data

Oct. 28, 2019 (FI) .................................. 20195920

(51) Int. Cl.
*B81B 3/00* (2006.01)
*B81C 1/00* (2006.01)

(52) U.S. Cl.
CPC ........ *B81C 1/00682* (2013.01); *B81B 3/0021* (2013.01); *B81B 2203/04* (2013.01); *B81B 2203/056* (2013.01); *B81C 2201/0132* (2013.01); *B81C 2201/0176* (2013.01)

(58) Field of Classification Search
CPC ............................................... B81B 2203/056
See application file for complete search history.

(56) References Cited

U.S. PATENT DOCUMENTS

| 2007/0141779 A1* | 6/2007 | Abelson ............... H01L 21/314 438/253 |
| 2008/0102204 A1 | 5/2008 | Elers |
| 2010/0242606 A1 | 9/2010 | Kanemoto |
| 2013/0299925 A1 | 11/2013 | Classen et al. |
| 2016/0167954 A1* | 6/2016 | Gogoi ..................... H01L 27/14 257/415 |

(Continued)

FOREIGN PATENT DOCUMENTS

| DE | 10 2014 224 568 A1 | 6/2016 |
| DE | 102017207453 A1 | 11/2018 |

(Continued)

OTHER PUBLICATIONS

Japanese Office Action dated Nov. 24, 2021 corresponding to Japanese Patent Application No. 2020-178583.

(Continued)

*Primary Examiner* — Moazzam Hossain
(74) *Attorney, Agent, or Firm* — Squire Patton Boggs (US) LLP

(57) ABSTRACT

A microelectromechanical device comprising a mobile rotor in a silicon wafer. The rotor comprises one or more high-density regions. The one or more high-density regions in the rotor comprise at least one high-density material which has a higher density than silicon. The one or more high-density regions have been formed in the silicon wafer by filling one or more fill trenches in the rotor with the at least one high-density material. The one or more fill trenches have a depth/width aspect ratio of at least 10, and the one or more fill trenches have been filled by depositing the high-density material into the fill trenches in an atomic layer deposition (ALD) process.

4 Claims, 6 Drawing Sheets

(56) References Cited

U.S. PATENT DOCUMENTS

2016/0178656 A1   6/2016  Zhang et al.
2017/0358483 A1  12/2017  Roy et al.

FOREIGN PATENT DOCUMENTS

JP    2010-508661 A    3/2010
JP    2019-521518 A    7/2019

OTHER PUBLICATIONS

Finnish Search Report dated Apr. 27, 2020 corresponding to Finnish Patent Application No. 20195920.
European Search Report dated Mar. 12, 2021 corresponding to European Patent Application No. 20197102.
G. Wang et al., "Application of Atomic Layer Deposition Tungsten (ALD W) as Gate Filling Metal for 22 nm and Beyond Nodes CMOS Technology," ECS Transactions, vol. 58, No. 10, Aug. 31, 2013, pp. 317-324, XP055784998.
Japanese Office Action corresponding to JP Application No. 2020-178583, dated May 17, 2022.

\* cited by examiner

MEMS ELEMENT WITH INCREASED DENSITY

FIELD OF THE DISCLOSURE

The disclosure relates to microelectromechanical (MEMS) devices, and more particularly to silicon MEMS devices with mobile structures. The present disclosure further concerns the use of materials heavier than silicon to increase the density of mobile structures.

BACKGROUND OF THE DISCLOSURE

Microelectromechanical (MEMS) devices are typically manufactured from silicon substrates. Each device should preferably consume as little surface area as possible on the substrate, so that the number of MEMS die per wafer can be maximized. However, miniaturization can lead to new challenges in devices such as accelerometers and gyroscopes, where an output signal is produced by measuring the movement of a mobile structure. When the size of the mobile structure is decreased, the output signal becomes more sensitive to the surrounding environment. Very small and lightweight structures may undergo undesired movements arising from the Brownian motion of surrounding gas molecules. This produces thermal noise in the output signal.

Thermal noise can be reduced by increasing the weight of the mobile structure. A weight increase (without an increase in area) can for example be achieved by preparing the structure from a thicker silicon substrate. However, the weight increase which can be obtained with thicker substrates is quite limited, and the structural variations that sometimes may arise from small irregularities in the manufacturing process will typically increase when thick substrates are used.

Weight can also be increased by depositing additional materials on the mobile structure. However, adding heavier materials on top of a silicon structure shifts the center of gravity of the structure away from the vertical midpoint of the device wafer. This may upset the balance of the mobile structure and render it sensitive to cross-axis movements, such as acceleration in a direction which differs from the intended measurement direction.

The weight of a mobile structure can alternatively be increased by increasing the density of the mobile structure in certain regions of the structure. Document US20160178656 discloses a silicon-based MEMS device which includes wells that are filled with high-density metal in a chemical vapour deposition, sputtering or electroplating process. A problem with this approach is that high-density metals cannot be conformally deposited into narrow and deep wells. The wells therefore have to be relatively wide, and the method is not suitable for small mobile structures where the effect of thermal noise is greatest. If the high-density-metal does not fill the well conformally, the center of gravity of the mobile structure may be displaced from the vertical midpoint of the wafer, which leads to the undesired cross-axis sensitivity described above.

Additionally, voids may form in the deposited high-density metal if the method of US20160178656 is used in narrow wells. This reduces the total mass of the metal in the well. Voids may also open in post-processing, causing production issues. Void formation can be reduced by using pyramid- or cone-shaped wells, but that automatically creates an uneven vertical mass distribution, which would also lead to cross-axis sensitivity.

BRIEF DESCRIPTION OF THE DISCLOSURE

An object of the present disclosure is to provide a method and an apparatus to alleviate the above disadvantages.

The object of the disclosure is achieved by a method and an arrangement which are characterized by what is stated in the independent claims. The preferred embodiments of the disclosure are disclosed in the dependent claims.

The disclosure is based on the idea of increasing the density of mobile silicon MEMS structures by depositing a high-density material into high-aspect ratio trenches using atomic layer deposition. An advantage of the method and arrangement of the disclosure is that the trenches can be filled conformally, so that the density of the mobile MEMS structure can be increased.

BRIEF DESCRIPTION OF THE DRAWINGS

In the following the disclosure will be described in greater detail by means of preferred embodiments with reference to the accompanying drawings, in which.

DETAILED DESCRIPTION OF THE DISCLOSURE

Figure 1:
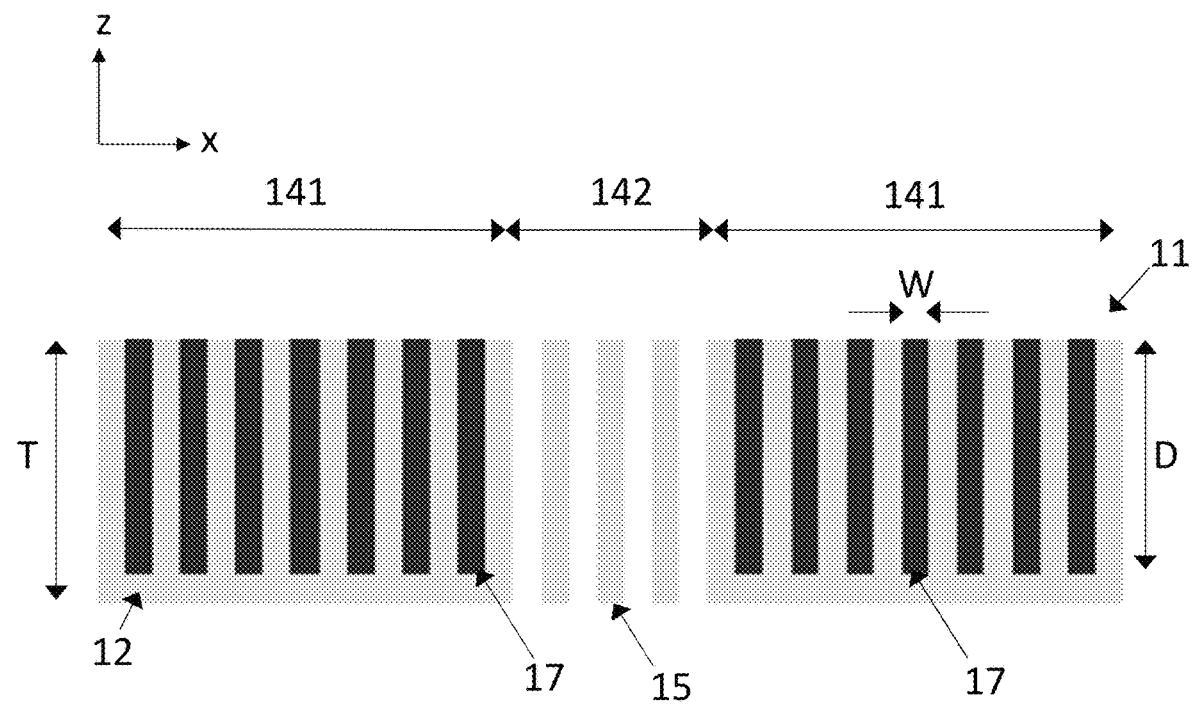
FIG. 1 illustrates a MEMS rotor with high-density regions in the main rotor body.

This disclosure describes microelectromechanical (MEMS) devices prepared in a silicon wafer. The silicon wafer may also be referred to as the device wafer. The micromechanical structures which constitute the MEMS device may be manufactured in the wafer by etching and coating methods. The term "silicon wafer" here refers to a thin substrate made of silicon, which forms the structure layer (which may also be called the device layer) in which microelectromechanical structures are manufactured by etching and coating the wafer. This substrate typically requires structural support from a separate, much thicker handle wafer or support wafer.

In this disclosure the plane which is parallel to the silicon wafer is illustrated and referred to as the xy-plane It may also be called the device plane. The term "horizontal" refers to this plane. The term "vertical" refers to the direction which is perpendicular to the horizontal device plane, and it is indicated as the z-axis in the figures. The terms "above" and "below" refer to differences in z-coordinates. The terms "height" and "depth" refer to vertical distances (in the z-direction), while "width" and "length" refer to horizontal distances (in either the x-direction or the y-direction).

Terms such as "vertical" or "horizontal" do not imply anything about the orientation of the silicon wafer when the MEMS device is manufactured, or when the device is in use. The device and the silicon wafer may be oriented in any suitable direction during usage or manufacturing, for example sideways in such a manner that a plane which is in this disclosure referred to as "horizontal" becomes a vertical plane. In other words, the terms "horizontal" and "vertical"

merely define two orthogonal directions, one of which is parallel to the surface of the silicon wafer, and the other normal to that surface.

Device Examples

This disclosure describes a microelectromechanical device comprising a mobile rotor in a silicon wafer. The rotor comprises one or more high-density regions. The one or more high-density regions in the rotor comprise at least one high-density material which has a higher density than silicon. The one or more high-density regions have been formed in the silicon wafer by filling one or more fill trenches in the silicon wafer with the at least one high-density material. The one or more fill trenches in the silicon wafer have a depth/width aspect ratio of at least 10. The one or more fill trenches have been filled by depositing the high-density material into the fill trenches in an atomic layer deposition (ALD) process. The shape of each high-density region corresponds to the shape of the fill trench in which it is formed.

In this disclosure, the term "rotor" refers to a mobile part in the device layer, designed to undergo movement when the device is in use. The movement may for example linear translation along any of the x-, y-, and/or z-axes, or rotation about one or more of these axes. Some movements may be induced by external forces, for example when the MEMS device undergoes acceleration or angular rotation. Other movements may be driven for example by capacitive or piezoelectric force transducers connected to the rotor. Other force transducers may be used to measure the movements of the rotor. In some applications, the rotor may be called a proof mass or a Coriolis mass.

The force transducers may for example be capacitive transducers which comprise a set of rotor electrodes on the rotor and a set of adjacent stator electrodes on a stator. In this context the term "stator" may for example refer to immobile parts of the device wafer (that is, parts which can for all practical purposes be considered stationary in the relation to the surrounding device package). Alternatively, the term "stator" may refer to other fixed structures adjacent to the device wafer, such as the walls of the enclosure or package where the MEMS device is enclosed. The rotor electrodes and stator electrodes may for example comprise a great number of interdigitated finger electrodes, or they may comprise just one rotor electrode plate paired with one stator electrode plate and arranged in parallel for a parallel-plate measurement.

The rotor may be suspended from a fixed structure by springs. The fixed structure may be the silicon wafer itself. The springs may be formed in the silicon wafer in the same etching process where the rotor is formed. The springs may be bars or beams with at least one suitably thin dimension which allows the springs to undergo flexible deformation. This flexible deformation allows the rotor to move. The movement of the rotor may be oscillation, in which case the spring constant of the suspension springs is one determinant of the oscillation amplitude. The springs may also be called suspenders.

FIG. 1 illustrates a side view of a rotor 11 in a MEMS device. The rotor has been formed in a silicon substrate 12. The rotor comprises first horizontal regions 141, where multiple fill trenches have been etched. The fill trenches have been filled with a high-density material in an ALD process to form a set of parallel high-density regions 17 (extending in the y-direction in this case) across each first horizontal region 141 in the silicon wafer 12. The rotor 11 also comprises a second horizontal region 142 where finger-shaped rotor electrodes 15, with high length/breadth and height/breadth aspect ratios, have been formed in the silicon wafer 12 (where length is measured in the y-direction perpendicular to the illustrated xz-plane, breadth is measured in the x-direction, and height is measured in the z-direction). The second horizontal region 142 comprises the rotor electrodes, illustrated as gray pillars. The rotor electrodes form a rotor comb structure. The second horizontal region 142 also comprises a set of separation regions, illustrated as white openings, which separate the rotor comb structure from the main body of the rotor. They also separate rotor combs from each other. These separation regions may also separate the rotor comb structure from an adjacent stator comb structure. To preserve clarity, the stator electrodes which may form an adjacent stator comb structure are not illustrated in this disclosure. These stator electrodes may for example be interdigitated with the rotor electrodes.

The rotor may also be a body without any rotor electrodes. The movement of the rotor may in this case be driven and sensed by piezoelectric actuators placed on the suspension springs. Capacitive electrodes and comb structures may then not be needed.

Surrounding structures, such as the fixed parts of the silicon wafer 12, or the suspension springs which suspend the rotor 11 from a fixed part, have not been illustrated in FIG. 1. FIG. 1 is not to scale.

The following considerations on the depth, geometry, deposition methods and materials apply to all embodiments presented in this disclosure.

The vertical depth of the fill trenches, which corresponds to the vertical height of the high-density regions 17, has been indicated with the letter D in FIG. 1. Each high-density region has the same vertical height D in FIG. 1. It may in some cases be beneficial to form high-density regions with different heights in the silicon wafer, but extra masking steps are then needed.

The height D of the high-density regions 17 may be almost equal to the thickness T of the silicon wafer 12, as illustrated in FIG. 1. The thickness T may for example be 50 µm, and the height D may be between 40 µm and 50 µm. The fill trenches may have a rectangular shape in the xy-plane, so that they extend linearly in the y-direction which is perpendicular to the xz-plane illustrated in FIG. 1. Alternatively, they may have any other suitable shape in the xy-plane, and this shape may be chosen based on design constraints such as the balancing of the rotor, or the area requirements of electrical wiring on the top surface of the silicon wafer 12.

The depth of the fill trenches, which typically corresponds to the height D, may for example be between 20 and 100 µm. This depth is limited by the wafer thickness T. The width W of the high-density regions 17 has also been indicated in FIG. 1. This width may be less than 10 µm, less than 5 µm, or less than 2 µm. The depth/width aspect ratio D/W of the fill trenches, which may correspond to the height/width aspect ratio of the high-density regions, may for example be greater than 10, greater than 15, or greater than 20. If the patterning of the fill trenches in the xy-plane is something else than rectangular, then a corresponding D/W aspect ratio may be calculated so that the width W corresponds to the narrowest parts of the trench pattern, and the resulting D/W values of the fill trenches may be any of the ones listed above.

In the xy-plane, a fill trench may for example have a quadratic, rectangular or circular pattern, or a cross-like pattern where two rectangles intersect each other, or any combination of these patterns. Differently patterned fill trenches may be formed in the same rotor, and the surface area of the fill trenches in the xy-plane can in general be freely optimized to meet any design considerations that may be important.

Trenches with high depth/width aspect ratios can be conformally filled by atomic layer deposition (ALD). Conformal filling means that the high-density material fills the trench without leaving any gaps or air pockets in any part of the trench, as illustrated in FIG. 1. The high-density material is thereby evenly distributed in the vertical direction in each fill trench, and the density distribution of the rotor corresponds to the distribution which was planned in the placement and geometry of the fill trenches.

The high-density material may be a carbide of tungsten, tantalum, yttrium, neodymium, cerium, lanthanum, zirconium, indium, niobium, molybdenum or hafnium, for example WC, $TaC_x$, where x is between 0.4 and 1, $YC_2$, $NdC_2$, $CeC_2$, $CeC_2$, $ZrC$, $NbC$, $Nb_2C$, $MoC$, $Mo_2C$, or $HfC$. Alternatively, the high-density material may be a nitride of tungsten, tantalum, yttrium, neodymium, cerium, lanthanum, zirconium, indium, niobium, molybdenum or hafnium, for example WN, $WN_2$, TaN or HfN. The high-density material may alternatively be an oxide of tungsten, tantalum or yttrium, for example $WO_3$, $Ta_2O_5$ or $Y_2O_3$. The high-density material may alternatively be a nitride-carbide, oxide-carbide or nitride-oxide composite of any element listed above, or a compound material which comprises two or more of the materials listed above.

Some of the materials listed above may have an amorphous structure. High-density regions formed from such materials exhibit low internal stress. Some of the listed materials are also not as sensitive to typical etching chemicals, such as HF, as metals are. This allows, for example, the manufacturing of high-density rotor electrodes, described in more detail below. Furthermore, some of the listed materials provide strong adhesion between a high-density region and a neighboring silicon surface.

Figure 2:
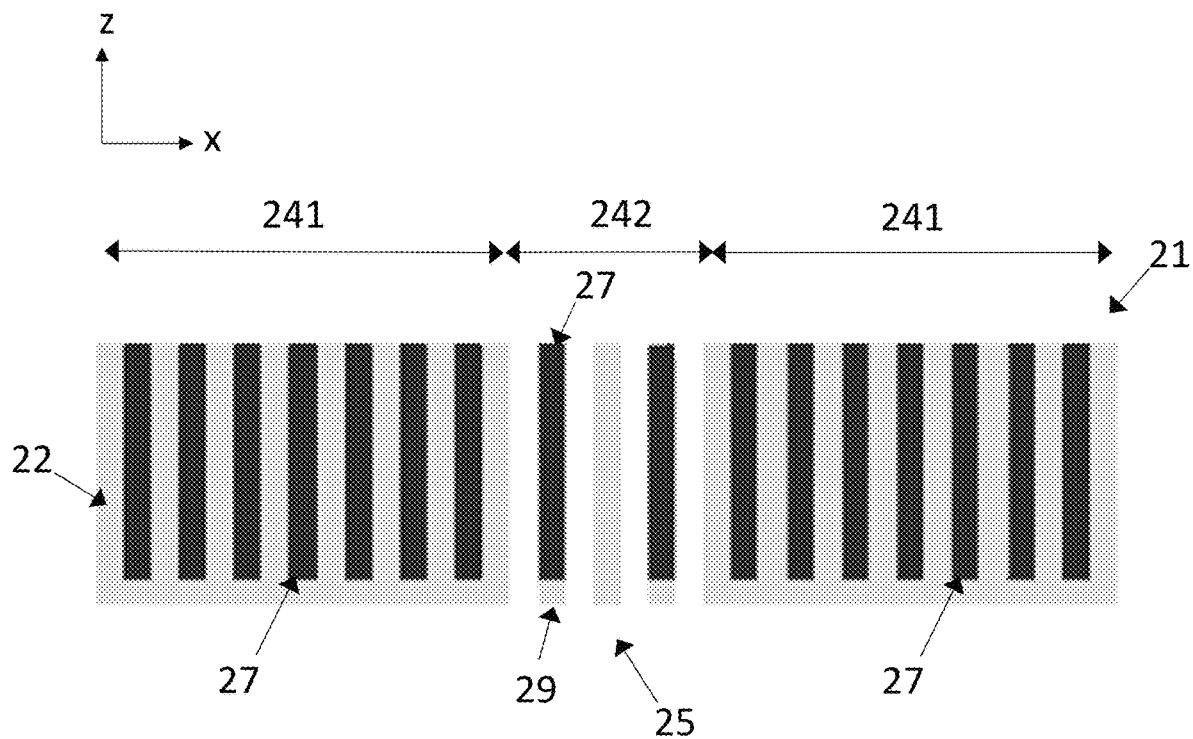
FIGS. 2-3 illustrate MEMS rotors with high-density regions in the main rotor body and in the rotor electrodes.

FIG. 2 illustrates a side view of a rotor 21 in an alternative embodiment. Reference numbers 21, 22, 25 and 241 correspond to reference numbers 11, 12, 15 and 141 in FIG. 1. However, the rotor 21 differs from the rotor 11 in that high-density regions 27 are also present in the second horizontal region 242, where rotor electrodes 25 are formed. In other words, at least some of the high-density regions 27 have been prepared in fill trenches which define the dimensions of the rotor electrodes, so that these high-density regions form a part of the rotor electrodes. The rotor electrodes which comprise high-density regions comprise rotor bases 29. As illustrated in FIG. 2, some of the rotor electrodes may comprise a high-density region, while others comprise only silicon. The device illustrated in FIG. 2 also comprises high-density regions 27 in the first horizontal regions 241. Alternatively, the rotor could comprise high-density regions only in the second horizontal region, so that only the rotor electrodes comprise high-density material.

Figure 3:
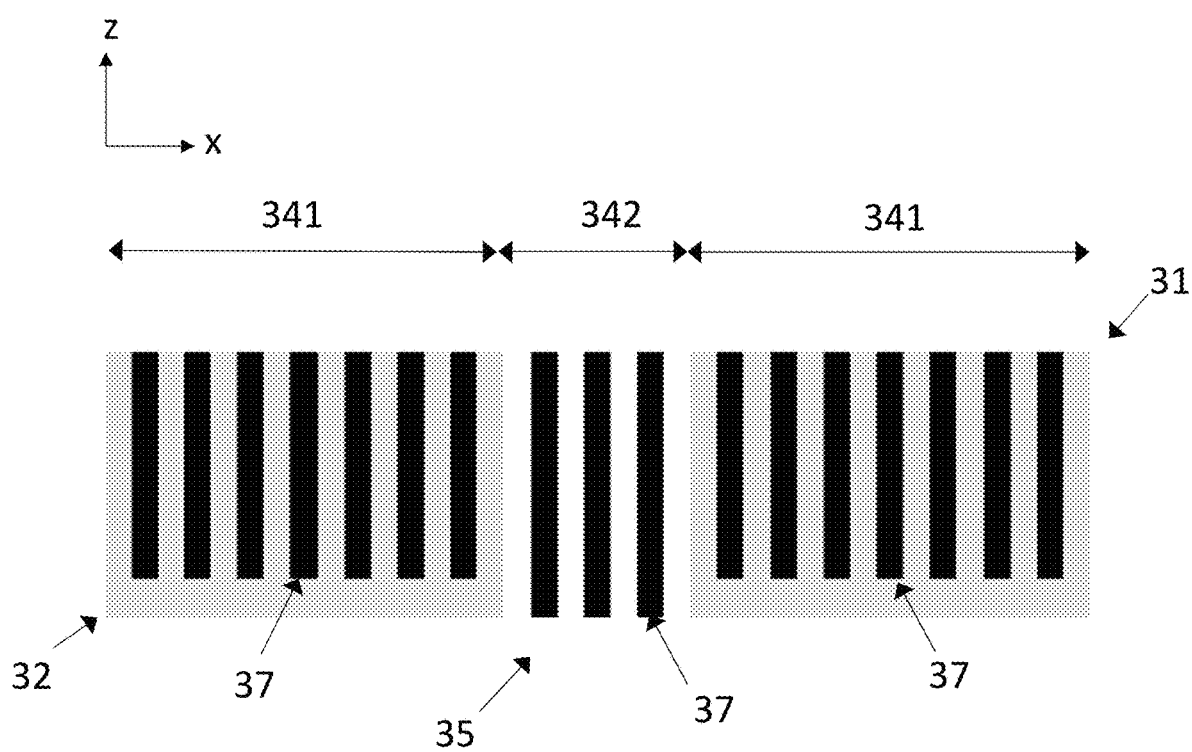

FIG. 3 illustrates a side view of a rotor 31 in an alternative embodiment. Reference numbers 31, 32 and 341 correspond to reference numbers 21, 22 and 241 in FIG. 2. The rotor 31 differs from the rotor 21 in that the high-density regions 37 in the second horizontal region 342 form the entirety of the corresponding rotor electrodes 35. In other words, the rotor electrodes do not include any rotor base such as 29 in FIG. 2. Some of the rotor electrodes may alternatively be made of silicon, while other are made of high-density materials. As before, the rotor may comprise high-density regions only in the second horizontal region 342, or in both regions 341 and 342.

In the rotors illustrated in FIGS. 1, 2 and 3, the center of gravity may be slightly displaced from the vertical midpoint of the wafer due to the fact that D is not equal to T (as illustrated in FIG. 1). The rotors may be rebalanced for example by depositing an additional layer of silicon on top of the rotor, with a thickness equal to T−D. Alternatively, additional balancing trenches (not illustrated) may be etched in the high-density regions. The mass which is removed from the high-density regions in the etching of these balancing trenches may for example be equal to $(R_{HD}-R_{Si})*(T-D)*A$, where $R_{HD}$ is the density of the high-density material, $R_{Si}$ is the density of silicon, and A is the horizontal area of the fill trench.

The one or more fill trenches in the rotor may define one or more rotor electrodes, so that the one or more rotor electrodes comprise high-density material. In other words, the one or more high-density regions may form one or more rotor electrodes in the rotor. The one or more rotor electrodes may be separated from a main rotor body and/or from one or more stator electrodes by a separation region. The rotor electrodes may form a rotor comb structure which comprises a set of parallel finger electrodes. Alternatively, the rotor electrodes may form a rotor plate structure. The rotor electrodes may be paired with an adjacent stator comb structure/stator plate structure so that they form a capacitive transducer which can be used to detect the motion of the rotor or to actuate the motion of the rotor. The high-density material used in the rotor electrodes should in this case be at least partly conductive to facilitate electrical measurement. The rotor electrodes may for example have any of the heights, widths, and height/width aspect ratios that were specified for the fill trenches above.

Increasing the density of the rotor electrodes may be particularly useful in applications where the second horizontal region horizontal 242 covers a relatively large proportion of the total horizontal surface area of the rotor, or where the rotor electrodes are the part of the rotor which is most distant from its rotation axis, or where fill trenches cannot be formed on the horizontal surfaces of the rotor in the first horizontal region.

Method Examples

Exemplary methods for manufacturing device structures with high-density regions will be described next. The methods comprise the steps of etching one or more fill trenches in the rotor in a plasma etching process (this step may be referred to as b1), wherein the one or more fill trenches have a depth/width aspect ratio of at least 10 and then filling the one or more fill trenches with a high-density material by depositing the high-density material into the one or more fill trenches by atomic layer deposition (this step may be referred to as b2), so that a high-density region is formed in the one or more fill trenches.

The plasma etching process may be a deep-reactive ion etching process (DRIE) or a wet etching process performed for example with potassium hydroxide (KOH) or tetramethylammonium hydroxide (TMAH).

High-density regions may be manufactured in the main rotor body (corresponding for example to first horizontal regions 141, 241 and 341 in FIGS. 1, 2 and 3, respectively) and/or in the rotor electrodes (corresponding to second horizontal regions 242 and 342 in FIGS. 2 and 3, respectively). These two approaches can be combined to form structures with high-density regions in both the main rotor body and the rotor electrodes, as FIGS. 2 and 3 illustrate. Unlike FIGS. 1-3, FIGS. 4, 5, 7 and 8 illustrate both a rotor (in the center) and the surrounding fixed structures in the device wafer (at the edges). FIG. 6 illustrates only a rotor.

In this context, the term "main rotor body" refers to the horizontal areas of the rotor which do not comprise rotor electrode structures. The main rotor body may be partly or fully coextensive with the first horizontal regions 141, 241 and 341, but it may also comprise regions where no high-density regions are present. The silicon wafer may, for example, comprise a main rotor body with no fill trenches and rotor electrodes made of high-density material.

Figure 4:
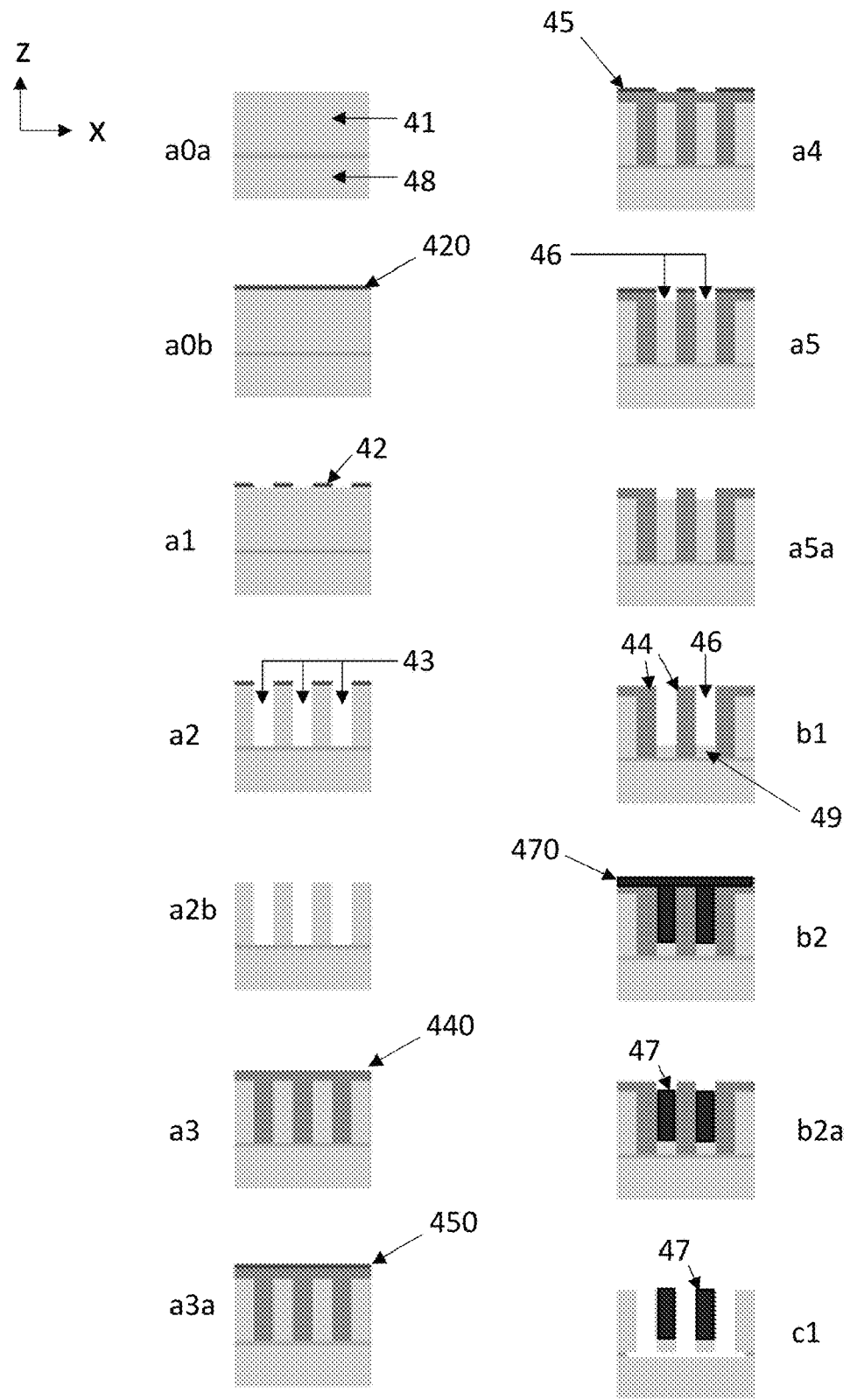
FIGS. 4-5 illustrates methods for preparing rotor electrodes from a high-density material.

FIG. 4 illustrates a method which can be used for preparing rotor electrodes formed from a high-density material, for example the rotor electrodes illustrated in FIGS. 2 and 3 above. Steps b1 and b2 have been indicated in the figure. The sequence starts from the top left figure, proceeds down along the left column, then continues from the top right figure and proceeds down the right column. A silicon-on-insulator (SOI) wafer is illustrated in step a0a, comprising the device wafer 41 on a handle wafer 48. The rotor is formed in the device wafer 41, which will be called the silicon wafer below.

A photoresistive material 420 is deposited on the silicon wafer 41 (step a0b), and this material is patterned (step a1) to form a first etching mask 42 on the upper surface of the rotor. The first etching mask 42 defines the horizontal dimensions of a separation region which separates one or more rotor electrodes from a main rotor body and/or from one or more stator electrodes. A set of first trenches 43 is then etched (step a2) in a plasma etching etch process in the regions of the rotor which are not protected by the first etching mask 42. After the optional removal (step a2b) of the first etching mask 42, the set of first trenches 43 is filled (step a3) with a self-supporting material 440. Another mask material 450 is then deposited (step a3a) on the silicon wafer and patterned (step a4) to form a fill trench etching mask 45 on the upper surface of the rotor, adjacent to the separation region, so that the fill trench etching mask 45 defines the horizontal dimensions of the one or more rotor electrodes. One or more fill trenches 46 are then etched (steps a5 and a5a) in the regions of the rotor which are not protected by the fill trench etching mask 45, and then steps b1 and b2 can be performed. The method may comprise an optional subsequent step where the high-density material is removed (step b2a), for example in a plasma etch process, from the top surface of the silicon wafer so that it only remains in the fill trenches. The self-supporting material is then removed (step c1) from the first trenches, so that the empty space in the first trenches now becomes a separation region. The high-density rotor electrodes 47 can then be released (step c1) from the silicon wafer by performing removing the adhesion layer which attaches the silicon wafer 41 to the handle wafer 48. The one or more rotor electrodes 47 are attached to the main rotor body at a point (not illustrated) which is displaced from the illustrated xz-plane in the y-direction.

In other words, high-density rotor electrodes 47 can be formed in the silicon wafer by etching the fill trenches 46 between the temporary walls 44 formed by the self-supporting material 440 in the steps a3, a3a and a4. The self-supporting material may also be called a temporary wall material. The term "self-supporting" refers in this context to the fact that this material should not collapse or deform under its own weight (or from any other factor that might influence it during the manufacturing process), even when it is not supported by a silicon wall. As illustrated for example in step b1, the temporary walls 44 remain standing in the position which was defined by the location of the first trenches 43 even when the fill trenches 46 are etched. The middle wall 44 illustrates an unsupported wall. In a practical embodiment where the one or more rotor electrodes comprise many finger electrodes, the majority of self-supporting temporary walls 44 would typically be unsupported.

The self-supporting material 440 may, for example, be silicon dioxide, and it may for example be deposited in a chemical vapour deposition process where tetraethylorthosilicate (TEOS) is used as a precursor. Alternatively, the self-supporting etching mask material may be silicon dioxide or silicon nitride, deposited in a chemical vapour deposition process or spin-on-glass process. The material of the self-supporting etching mask may also be metallic, for example aluminium deposited in a PVD process, or aluminium oxide $Al_2O_3$ deposited by atomic-layer deposition. Other alternatives include polymers such as polyimide, or photoresists, deposited by vapour deposition or spray coating.

In practice, the physical properties required from a self-supporting material will depend on the dimensions of the micromechanical structures etched in the silicon wafer, particularly the dimensions of the first trenches 43. If the first trenches 43 are relatively wide in the x-direction, then even a relatively flexible and/or malleable material 440 can form a robust temporary wall 44. Narrower dimensions require a more rigid and/or sturdy material 440 to ensure that the temporary walls 44 are not deformed during processing.

The fill trenches 46 may be etched almost all the way through the silicon wafer 41, so that a thin silicon base 49 forms the bottom of each rotor electrode 47, as illustrated in step b1. The high-density material 470 will then rest on the underlying base 49. If the base 49 is thin, or if it is removed after step c1, then it should be ensured that the adhesion between the high-density material and the silicon rotor is sufficiently strong to support the weight of the high-density rotor comb structure at the point where it is attached to the main rotor body.

Although FIG. 4 illustrates a process performed on a SOI wafer, the same process can be used with small modifications also on a silicon wafer which is attached to a handle wafer in another way. It may for example be suspended over a handle wafer so that there is an open space (or cavity) between the handle wafer and the silicon wafer.

Figure 5:
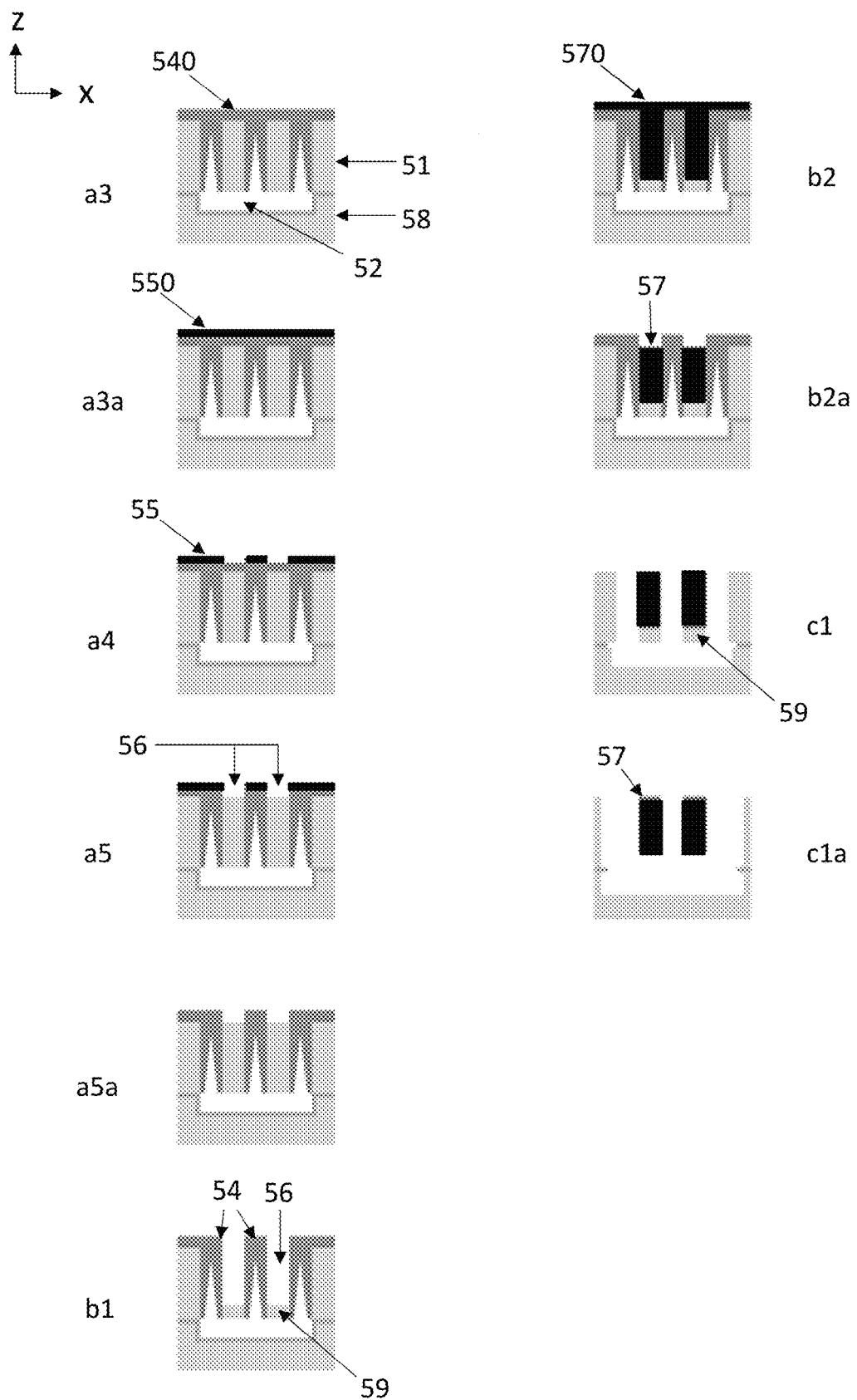
Figures 6, 7:
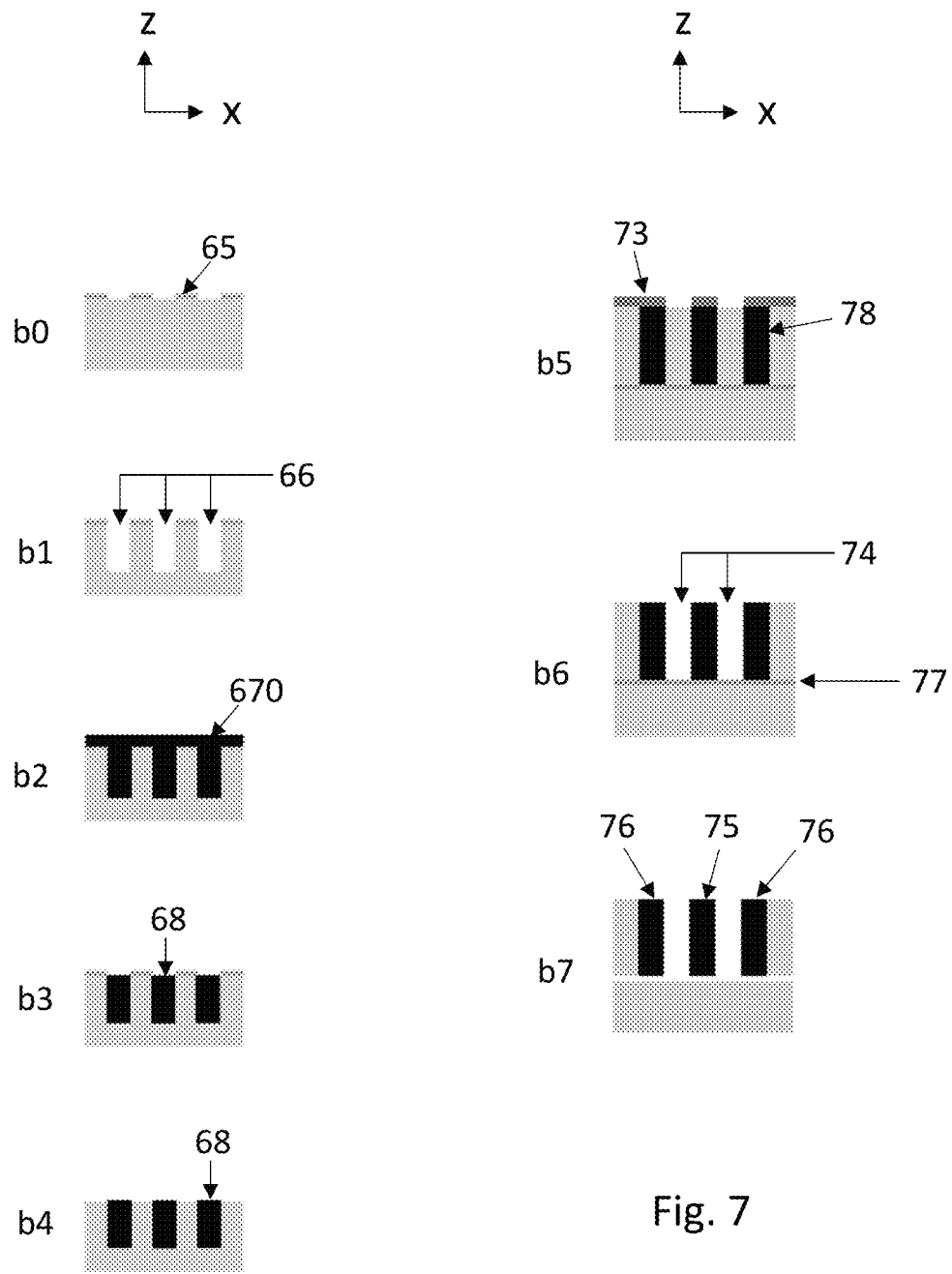
FIG. 6 illustrates a method for preparing high-density regions in the main rotor body.
FIGS. 7-8 illustrate methods for preparing rotor electrodes and/or stator electrodes from a high-density material.

FIG. 5 illustrates in more detail a process for manufacturing high-density rotor electrodes in a silicon wafer 51 with a cavity 52 underneath at least the second horizontal region. The silicon wafer 51 rests on a handle wafer 58 outside the cavity walls. A mobile rotor is in this case formed above the cavity, and it may move partly into and out of the cavity when the device is in use. Reference numbers 540, 550, 570 and 54-59 in FIG. 5 correspond to reference numbers 440, 450, 470 and 44-49, respectively, in FIG. 4. The steps which precede step a3 in FIG. 5 also correspond to steps a0a-a2b in FIG. 4. The presence of the cavity 52 does not influence these steps—the first trenches are etched through the silicon wafer 51 just as they are etched through silicon wafer 41 in step a2 of FIG. 4. Steps b1-b2a in FIG. 5 also correspond directly to steps b1-b2a in FIG. 4.

The self-supporting material 540 may be any of the materials mentioned in the previous example. However, the range of possible materials may be limited by the chosen deposition method, or vice versa. FIG. 5 illustrates schematically the shape that the self-supporting walls 54 may take when the first trenches have a high depth-to-width aspect ratio and the self-supporting material 540 is deposited in a vapour deposition process. The shape illustrated in FIG. 4, on the other hand, corresponds to the shape that the self-supporting walls assume if the self-supporting material is deposited by atomic layer deposition.

It can be seen in FIG. 5 that an open space with a pointed cross-section has been formed within the first trenches (step a3), because a vapour deposition process typically fills the top of the first trenches faster than it fills their bottom. The same pointed cross-section is then preserved in the self-supporting walls 54 when the fill trenches 56 are etched (step b1). This may sometimes limit the material choices or deposition methods available for the self-supporting material 540. The walls 54 should have sufficient structural integrity to carry some of the weight of the high-density regions 57 in step b2a without additional support from below. However, once the formation of the high-density rotor electrodes has been completed (for example in step c1a), their full weight is carried by the main rotor body at the attachment point which is not illustrated in FIG. 57 because it lies at another y-coordinate.

Once the high-density rotor electrodes 57 have been formed in step b2, superfluous layers of high-density material may be removed in a plasma etching process in step b2a, so that it only remains in the fill trenches. The self-supporting material is then removed (step c1) from the first trenches, so that this area becomes a separation region. Fill trenches 56 should preferably be etched to such a depth that a base 59 of suitable thickness underlies each fill trench (step b1). This base 59 will remain underneath the high-density regions after the self-supporting material is removed. In this case, the base 59 may be entirely removed from the high-density rotor comb structure 57 by performing an isotropic etch in the cavity 52 after the self-supporting material has been removed (step c1a).

FIG. 6 illustrates a method for preparing high-density regions in the main rotor body. Steps b1 and b2 have again been indicated, and reference numbers 65, 66 and 670 correspond to reference numbers 45, 46 and 470, respectively, in FIG. 4. In this case, the fill trenches 66 are formed in the main rotor body. The fill trenches 66 are filled with a high-density material 670 in an atomic layer deposition process. The parts of the high-density material 670 which overlie the entire rotor are removed as in FIG. 4, and high-density regions 68 then form a part of the main rotor body in the final step b4 when the process has been completed.

The process illustrated in FIG. 6 could be continued by etching a set of second trenches along the boundaries of each high-density region 68 and then releasing the high-density regions from the underlying wafer. The high-density regions could then form high-density rotor electrodes, as in the previous example. However, it is typically difficult to align the mask which controls the etching of these second vertical trenches with the boundaries of the high-density regions 68 so that high precision and reproducibility is obtained.

FIG. 7 illustrates a method for preparing high-density rotor electrodes, such as the rotor electrodes illustrated in FIG. 3, and optionally also adjacent stator electrodes made of the same high-density material. High-density regions 78 are formed in a silicon-on-insulator wafer for example in the same manner as regions 68 in FIG. 6. One or more separation trenches 74 are then etched in the regions which are not protected by a separation trench mask 73. The separation trenches may separate adjacent electrode structures from each other. The insulating layer 77 is then removed at least from the region which underlies the rotor. In this case, rotor electrode 75 is the only mobile part in FIG. 7, but the rotor could include any of the structures discussed in relation to FIGS. 1, 2 and 3 above. High-density regions 76, which remain fixed to the device wafer, may for example be used stator electrodes for a parallel-plate measurement in the x-direction. The stator electrodes could alternatively be finger electrodes interdigitated with the finger-shaped rotor electrodes 75, but this option is not illustrated in FIG. 7.

Figure 8:
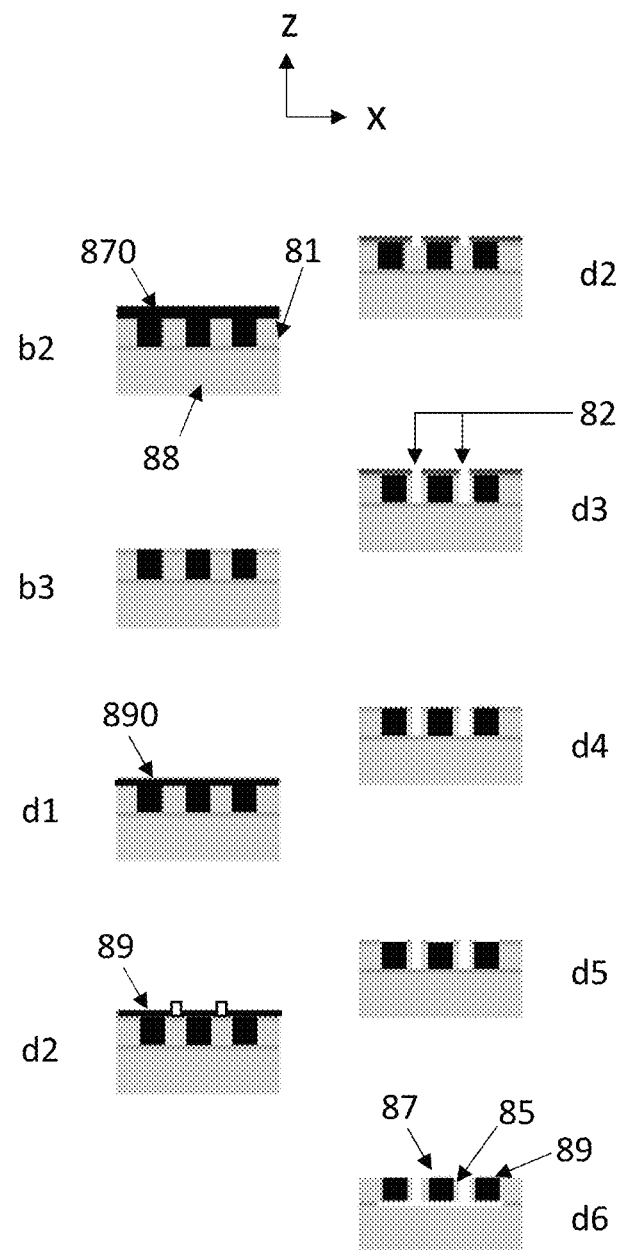

It may in some applications be preferable to deliberately produce rotor electrodes where a high-density region is sandwiched between layers of silicon. FIG. 8 illustrates how this process can be carried out in a SOI wafer, where a device wafer 81 is attached to a handle wafer 88.

Step b2 in FIG. 8 corresponds to step b2 in FIG. 6, and reference number 870 corresponds to 670 in FIG. 6. The steps which follow b2 in FIG. 8 differ from those that follow b2 in FIG. 6. A trench mask material 890 is deposited on the silicon wafer (step d1) and patterned to form a trench mask 89 (step d2). As illustrated in step d2, the trench mask 89 covers each high-density region and extends a slight distance across each boundary between a high-density region and the adjacent silicon region.

Second vertical trenches 82 are then etched in a DRIE process (step d3), and the trench mask 89 and any other remaining masks are removed (steps d4 and d5). Each high-density rotor electrode 87 now comprises a high-density region in the center, flanked by a silicon wall 85 on both sides. In other words, the high-density region in the high-density rotor electrode 87 is sandwiched between two silicon walls 85. In the SOI wafer illustrated in FIG. 1, the rotor comb structure is then released by etching away the adhesion layer which attaches the device wafer 81 to the handle wafer 88. No release step may be needed if the same process is carried out in a suspended silicon wafer. The optional adjacent stator electrodes 89 may also be flanked by a similar silicon wall.

Some high-density materials may be sensitive to the etchants that are used in DRIE etching of deep vertical trenches in the silicon wafer, or in the isotropic release etch. Other high-density materials are not sensitive to such etchants. In the processes illustrated in FIGS. 4 and 5, the high-density material 470/570 should preferably not be sensitive to the etchant used for removing the self-supporting walls 44/54.

The invention claimed is:
1. A microelectromechanical device, comprising:
a mobile rotor in a silicon wafer, wherein the rotor comprises a main rotor body and one or more rotor electrodes, and the device also comprises a fixed stator with one or more stator electrodes, and the one or more rotor electrodes are paired with the adjacent one or more stator electrodes so that they form a capacitive transducer which can be used to detect the motion of the rotor or to actuate the motion of the rotor,
and the rotor is suspended from a fixed structure by flexible springs which allow the rotor to move in relation to the stator, and the rotor comprises one or more high-density regions, and the one or more high-density regions in the rotor comprise at least one high-density material which has a higher density than silicon, and the one or more high-density regions have been formed in the silicon wafer by filling one or more fill trenches in the rotor with the at least one high-density material,
wherein the one or more fill trenches wafer have a depth/width aspect ratio of at least 10, and that the one or more fill trenches have been filled by depositing the high-density material into the fill trenches in an atomic layer deposition (ALD) process,
the one or more high-density regions form the one or more rotor electrodes in the rotor, and the one or more rotor electrodes are separated from the one or more stator electrodes by a separation region.

2. A device according to claim 1, wherein the high-density material comprises a carbide of tungsten, tantalum, yttrium, neodymium, cerium, lanthanum, zirconium, indium, niobium, molybdenum or hafnium.

3. A method according to claim 1, wherein the high-density material comprises a nitride of tungsten, tantalum, yttrium, neodymium, cerium, lanthanum, zirconium, indium, niobium, molybdenum or hafnium.

4. A method according to claim 1, wherein the high-density material comprises an oxide of tungsten, tantalum or yttrium.

\* \* \* \* \*